(12) United States Patent
Klein

(10) Patent No.: US 6,291,096 B1
(45) Date of Patent: Sep. 18, 2001

(54) PASS/FAIL BATTERY INDICATOR AND TESTER

(75) Inventor: David N. Klein, Franklin, MA (US)

(73) Assignee: The Gillette Company, Boston, MA (US)

( * ) Notice: Subject to any disclaimer, the term of this patent is extended or adjusted under 35 U.S.C. 154(b) by 0 days.

(21) Appl. No.: 09/293,168

(22) Filed: Apr. 16, 1999

(51) Int. Cl.⁷ .................................................. H01M 10/48
(52) U.S. Cl. ................................................. 429/90; 429/93
(58) Field of Search ........................................ 429/90, 93

(56) References Cited

U.S. PATENT DOCUMENTS

| | | | |
|---|---|---|---|
| 4,027,231 | 5/1977 | Lohrmann | 324/29.5 |
| 5,202,063 | 4/1993 | Andrews et al. | 264/4.6 |
| 5,225,104 | 7/1993 | Van Steenkiste et al. | 252/299.01 |
| 5,285,299 | 2/1994 | Drzaic et al. | 359/52 |
| 5,389,470 | 2/1995 | Parker et al. | 429/90 |
| 5,397,503 | 3/1995 | Yuasa et al. | 252/299.01 |
| 5,460,902 | 10/1995 | Parker et al. | 429/90 |
| 5,610,511 | 3/1997 | Parker | 324/106 |
| 6,084,380 * | 9/2000 | Burton | 320/107 |
| 6,118,426 * | 9/2000 | Albert | 345/107 |

FOREIGN PATENT DOCUMENTS

| | | |
|---|---|---|
| 0 501 609 A1 | 9/1992 | (EP) . |
| 56-87021 | 7/1981 | (JP) . |
| 61-169781 | 7/1986 | (JP) . |
| 8-203567 | 8/1996 | (JP) . |
| 10-268798 | 10/1998 | (JP) . |
| WO 97/11360 | 3/1997 | (WO) . |
| WO 99/05745 | 2/1999 | (WO) . |
| WO 00/26761 | 5/2000 | (WO) . |

OTHER PUBLICATIONS

"All Printed Bistable Reflective Displays: Printable Electrophoretic Ink and All Printed Metal—Insulator—Metal Diodes", Massachusetts Institute of Technology, 6/98, pp. 1–19.
"Electrophoretic Displays", J.C. Lewis, 1976, pp. 223–240.
?Electrophoretic Displays, A.L. Dalisa, pp. 213–232, 1976.
"The Reinvention of Paper", Scientific American, Sep. 1998, pp. 36, 40.
"An Electrophoretic Ink for All–Printed Reflective Electronic Displays", Comiskey et al., Nature, vol. 394, Jul. 16, 1998; pp. 253–255.
"Electronic Ink: A printable display system", Comiskey et al., Jun. 1997, pp. 1–3.
"Easy Reader", J. Wilson, Popular Mechanics, 11/1998, pp. 94–96, 98.

* cited by examiner

Primary Examiner—Gabrielle Brouillette
Assistant Examiner—Mark Ruthkosky
(74) Attorney, Agent, or Firm—Fish & Richardson P.C.

(57) ABSTRACT

A battery tester, includes a voltage controlled display. The battery tester is disposed on a battery with a first voltage divider having a terminal coupled to a terminal of the voltage controlled display and a second voltage divider having a terminal coupled to a second terminal of the voltage controlled display. The second voltage divider includes a non-linear device. A major advantage of the tester compared to other testers is that a consumer can merely look at the tester on the battery to determine whether the battery is good or not. This tester eliminates the need to hold the battery and depress a switch to engage the battery tester.

22 Claims, 8 Drawing Sheets

MIM Varistors Printed with Different P:B Ratios
Wet Thickness = 15 MIL

PASS/FAIL BATTERY INDICATOR AND TESTER

BACKGROUND

This invention relates to battery testers that can be incorporated on battery packaging.

Known types of battery testers that are placed on batteries are so called "thermochromic" types. In a thermochromic battery tester there can be two electrodes that are connected by a consumer manually depressing a switch. Once the switch is depressed, the consumer has connected an anode of the battery to a cathode of the battery through the thermochromic tester. The thermochromic tester includes a silver conductor that has a variable width so that the resistance of the conductor also varies along its length. As current travels through the silver conductor, the current generates heat that changes the color of a thermochromic ink display that is over the silver conductor. The thermochromic ink display is arranged as a gauge to indicate the relative capacity of the battery. The higher the current the more heat is generated and the more the gauge will change to indicate that the battery is good.

Sometimes the switch can be hard for people to depress and it can become difficult to tell whether the tester worked or not or whether the battery is good or bad. This can be confusing to a consumer. Depressing the switch makes a direct relatively high conductance connection between the anode and cathode of the cell which can draw significant power and reduce battery lifetime. Battery heat can also give a false indication of the state of charge of the battery.

SUMMARY

According to an aspect of the invention, a battery tester, includes a voltage controlled display, a first voltage divider having a terminal coupled to a terminal of the voltage controlled display and a second voltage divider having a terminal coupled to a second terminal of the voltage controlled display. The second voltage divider includes a nonlinear device.

A major advantage of the tester compared to other testers is that a consumer can merely look at the tester on the battery to determine whether the battery is good or not. This tester eliminates the need to hold the battery and depress a switch to engage the battery tester. This tester although always on, uses very little current and hence power. The tester may be more efficient than prior testers depending on how many times a consumer presses the switch on the prior tester. Over the lifetime of a battery, this tester may use less current or be comparable to the thermochromic approach.

The tester includes a voltage sensitive display and a nonlinear element that could be a metal-insulator-metal diode (M-I-M diode) or a transistor. The voltage sensitive display uses a material that switches based on the voltage. The display does not use a large amount of current so it would not significantly drain the battery that is the power source for the display. The battery tester, of course, does not have to be an "always on" tester. The nonlinear element enables switching of the display to indicate a good or bad condition.

DESCRIPTION

Figure 1:
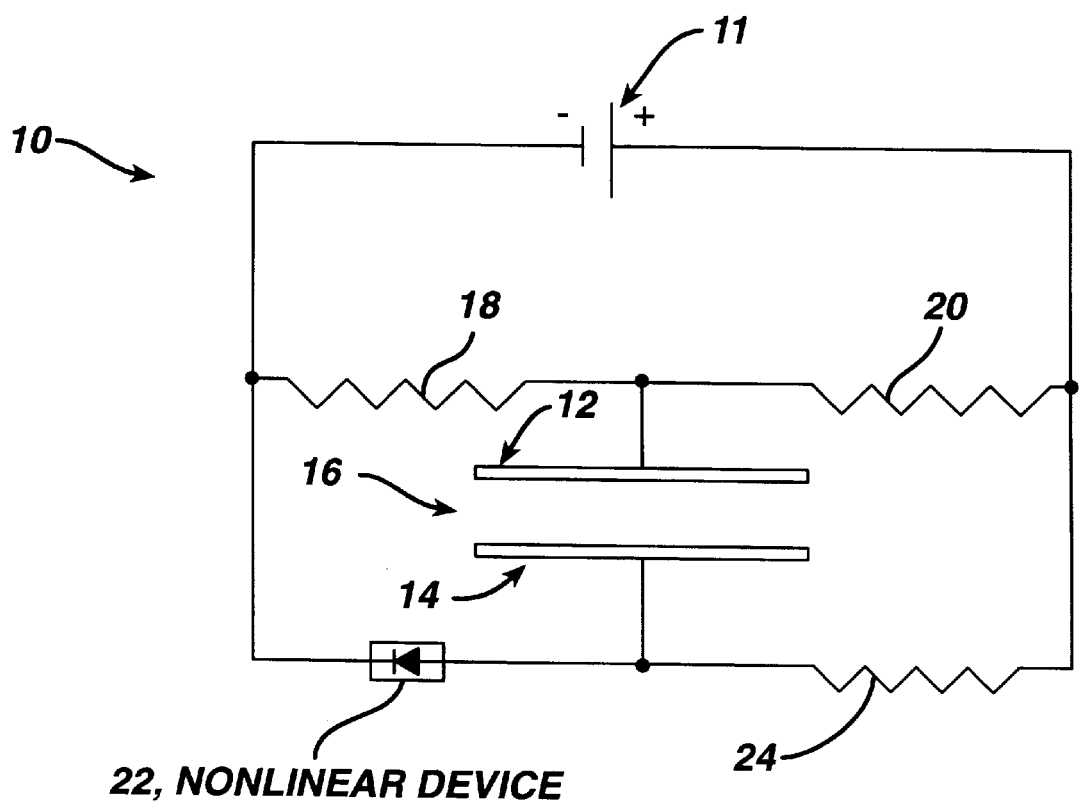
FIG. 1 is a schematic diagram of a battery tester including a voltage controlled, low power display.

Referring now to FIG. 1, a battery tester 10 is coupled to a battery 11. The battery tester 10 includes a parallel circuit including a display device 16 disposed between two electrodes 12, 14 that are in parallel. Electrode 12 is connected to the circuit 10 at a voltage divider provided by two resistors, 18 and 20. Electrode 14 is connected to the other side of the parallel circuit. The other side of the parallel circuit has a nonlinear element, i.e., a switch 22 and a third resistor 24.

The display device 16 is an ultra-low current, voltage controlled type of display. One type of device is an electrophoretic display device such as described in "All Printed Bistable Reflective Displays: Printable Electrophoretic Ink and All Printed Metal-Insulator-Metal Diodes" Massachusetts Institute of Technology June 1998 and provided by E-INK, Inc. Cambridge, Mass. This type of display is based on so called "electronic inks", e.g., electrophoretic materials that change their based on an applied voltage. Using electrophoretic materials such as electronic ink, a flat panel display can be printed on a substrate material. These displays draw very little current and hence dissipate very little power. Any voltage sensitive material could be used as the display. Another material that has similar properties is described in "The Reinvention of Paper", Scientific American, September 1998 and is called Gyricon. Gyricon is also a voltage sensitive material. The display 16 operates at voltages that are within the range of the battery that the tester 10 is monitoring.

The non-linear device 22 can be any non-linear device. A preferred example is a so-called Metal-Insulator-Metal diode, (M-I-M diode) also generally described in the above paper.

A preferred M-I-M diode is described below in conjunction with FIGS. 3–6.

The voltage potential at terminal 12 will always have, half of the battery cell voltage across it if the value of resistor 18 equals the value of resistor 20. The potential of the electrode 14 is determined by voltage across the nonlinear element 22 and resistor 24. The voltage at terminal 12 will start at a known value depending on the values of resistors 18, 20 and 24. As current is drawn from the battery due to use or leakage, the voltage of electrode 12 will vary with respect to the voltage at electrode 14. Since element 22 is non linear, at some point it will switch causing the voltage at electrode 12 to become negative with respect to the voltage of electrode 14. When the non-linear element switches, this would flip the polarity on the display causing the display to change color indicating that the battery is no longer within some defined specification. The display can be wired into the circuit so that it could either turn on or turn off to indicate that the battery is no longer within some defined specification. In either event the battery tester works on the principle that the display exhibits a change in color when there is a change in the status i.e., good to bad of the battery cells.

Since the battery tester 10 is a printed device, the non-linear device can be provided with carbon ink based electrodes, as will be described below. The resistors can also be carbon based and include a filler to reduce the conductivity of the resistors to make them more resistive. Ideally the entire battery tester 10 should have a very high total resistance, e.g., on the order of 15 meg-ohms. For a 1.5 volt cell that would provide a tester 10 that draws 100 nano-amps (na) of current which is a low enough current level to have a minimum impact on the lifetime of the battery. For example, a "double A" cell with a 7 year lifetime, a 100 na draw would consume only about 0.5 percent of the battery's capacity.

Figure 2:
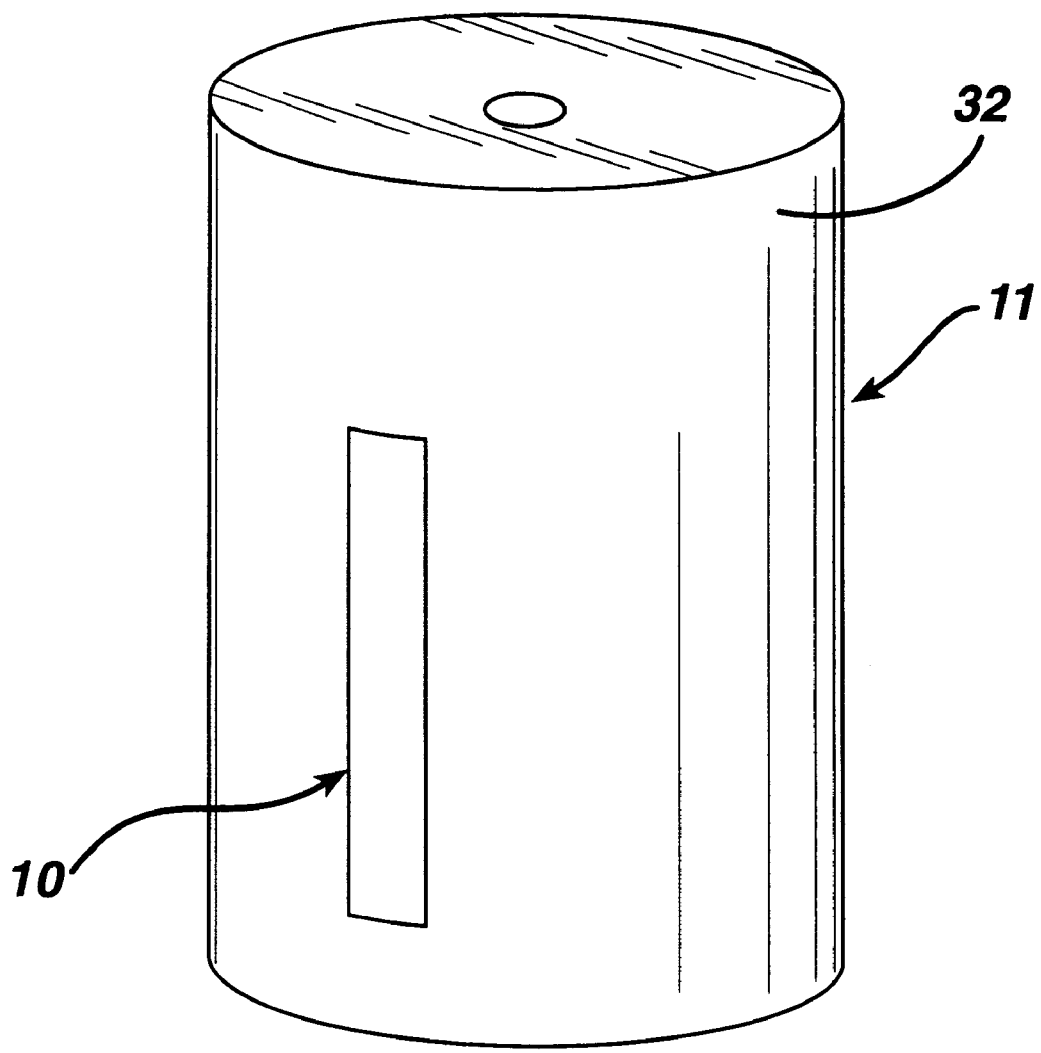
FIG. 2 is a diagrammatical view of a battery incorporating the battery tester of FIG. 1.

Referring now to FIG. 2, the battery 11 is shown having the battery tester 10 incorporated into a label 32 that surrounds the outer circumference of the battery 30. The tester 10 devices such as, the resistors 18, 20 and 24 and the nonlinear device 22 (all not shown in FIG. 2) can be printed using screen printing or draw-down bar printing techniques under the label 32 whereas, the display 16 would be printed over the label 32 or under a transparent portion of the label 32. By visual inspection alone a consumer can tell by the state of the display either or one color or another whether the battery 30 meets or does not meet a specified criterion such as charged or discharged. A state of charged would be indicated by one color whereas a state of discharge would be indicated by a different color.

Alternatively, the tester could be a manually activatable tester using the voltage controlled display which is either incorporated on the cell and activated by pressing contacts, or incorporated into battery packaging.

Figure 3:
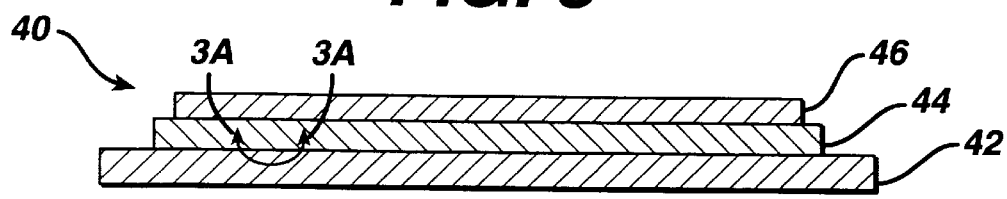
FIG. 3 is a cross-sectional view of an M-I-M diode structure useful in the tester of FIG. 1.
Figure 3A:
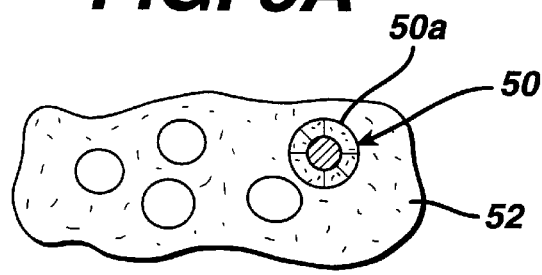
FIG. 3A is a blowup view taken along line 1A—1A of a portion of FIG. 3.

Referring now to FIG. 3, a metal-insulator-metal diode 40 is shown. The metal-insulator-metal diode 40 includes a first electrode 42, e.g., a copper foil substrate or another conductive material such as carbon or gold or other conductive materials such as chromium, tungsten, molybdenum, or other conductive materials such as metal particles dispersed in a polymer binder such as a conductive ink. The metal-insulator-metal diode 40 further includes a composite metal-insulator layer 44 comprised of metal particles 50 suspended in a dielectric binding layer 52. As shown in FIG. 3A, the metal particles 50 have an intrinsic oxide layer 50$a$ that covers the surface of the particles 50. One preferred metal is tantalum that readily forms an intrinsic, stable and generally uniform intrinsic oxide layer 50$a$. Other metals can be used such as niobium. These other metals should form oxides that are self-limiting, stable, and having a suitable dielectric constant for the application. One reason that tantalum is preferred is that the intrinsic oxide layer forms readily on tantalum upon its exposure to air.

Disposed on the composite metal-insulating layer 44 is a second electrode 46 also comprised of e.g., copper or another conductive materials such as a carbon, chromium, tungsten, molybdenum, or gold or other conductive materials. The second electrode is preferably disposed directly on the layer 42 to be in contact with the intrinsic oxide layer 50$a$ on the particles 50. The second electrode also can be a composite layer including the conductive materials and a binder. By varying the conductivity of the electrode layer 46, the electrical characteristics of the device 40 can be changed. Specifically, the I-V characteristic curve can be made sharper to obtain a steeper on/off characteristic. That is, the higher the electrical conductivity, the sharper the curve.

As will be described below in FIGS. 7A–7D, the M-I-M device has a symmetrical current-voltage (I-V) characteristic curve exhibiting diode-like properties. The device also can be made to have lower switching voltages than other approaches, e.g., less than 10 volts and more specifically less than 1 volt to about 0.5 volts but with the same symmetrical properties. By varying the ratio of the tantalum to the binder and also the thickness of the tantalum-binder layer enables shifting of the I-V characteristic curve for the same material up or down within a range of plus/minus 50% or more.

The switching voltage of the device 40 can be more consistent from device to device. This may occur due in part to the more consistent oxide layer thickness and quality of the intrinsically formed oxide. The thickness of the tantalum oxide layer 50$a$ does not vary widely compared to thermal annealing or anodized oxide layers. It is believed that the intrinsic layer 50$a$ also has a substantially uniform thickness from tantalum particle 50 to tantalum particle 50 that is on the order of monolayers of thickness. Characteristics of the tantalum particles are that the powder has a particle size in a range less than 0.5 microns up to about 10's of microns. The printed layer 44 can have a thickness less than 0.5 mils up to 8–10 mils. Other particle sizes and thicknesses could be used herein.

Figure 4:
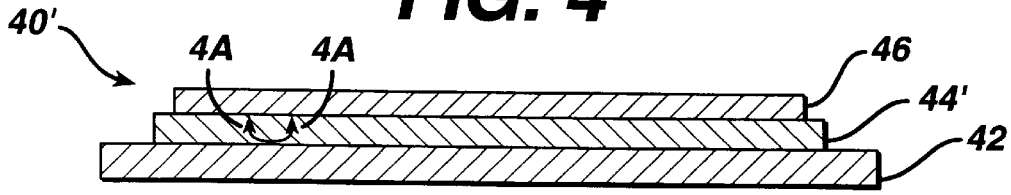
FIG. 4 is a cross-sectional view of an alternative M-I-M diode structure.
Figure 4A:
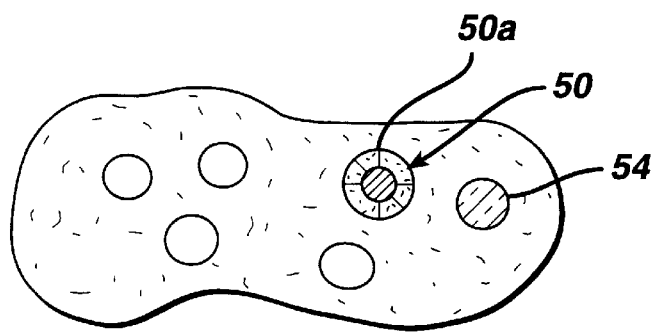
FIG. 4A is a blowup view taken along line 4A—4A of a portion of FIG. 4.

Referring now to FIG. 4, another embodiment 40' of the diode includes a layer 44' comprising inert particles 54 (as shown in FIG. 4A) of another dielectric material such as particles 54 of titanium dioxide $TiO_2$ or magnesium carbonate $MgCO_3$ dispersed within the polymer binder 52 and the tantalum particles 50 having an oxide layer 50$a$. In this embodiment, a portion (e.g., 0% to 75%) of the tantalum particles 50 are replaced with inert dielectric material particles 54 such as the titanium dioxide or magnesium carbonate. The tantalum particles 50 can optionally have an annealed oxide or other type of oxide layer disposed about the tantalum although, the intrinsic oxide layer 50$a$ alone is preferred.

The addition of dielectric particles of e.g., titanium dioxide solids to the polymer binder 52 and the tantalum particles 50 can improve printing of the layer 44', enabling use of lower amounts of tantalum particles while still maintaining a high solids content that would exhibit good diode properties. This would be particularly desirable with very thin layers of the metal/insulating material layer to avoid shorting of the two electrodes 42 and 46 through the layer 44'. Including an inert material reduces the probability of shorting and provides a more consistent film/coating.

Moreover, at sufficiently low concentrations of tantalum, devices may be provided with higher switching voltages. It is anticipated that rather than using the oxide layer around the tantalum particles to act as the insulator, i.e., the potential barrier that electrons need to exceed in order to cause conduction, the barrier would be governed by the dielectric properties of the inert material, e.g., the titanium dioxide and the binder at the lower concentrations of tantalum.

Figure 5:
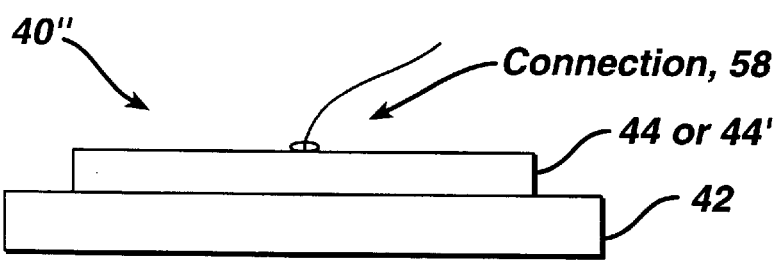
FIG. 5 is cross-sectional view of another alternative M-I-M diode structure.

Referring now to FIG. 5, another embodiment 40" of the diode has the first electrode 42 and the metal-insulating layer 44 or 44' on the first electrode. This structure 40" may give similar diode properties when a connection 58 is made to the metal-insulating layer 44 or 44'. By eliminating the second electrode, the device 40" can have fewer layers, changing the fabrication process without substantially altering the characteristics of the metal insulator layer.

Figure 6:
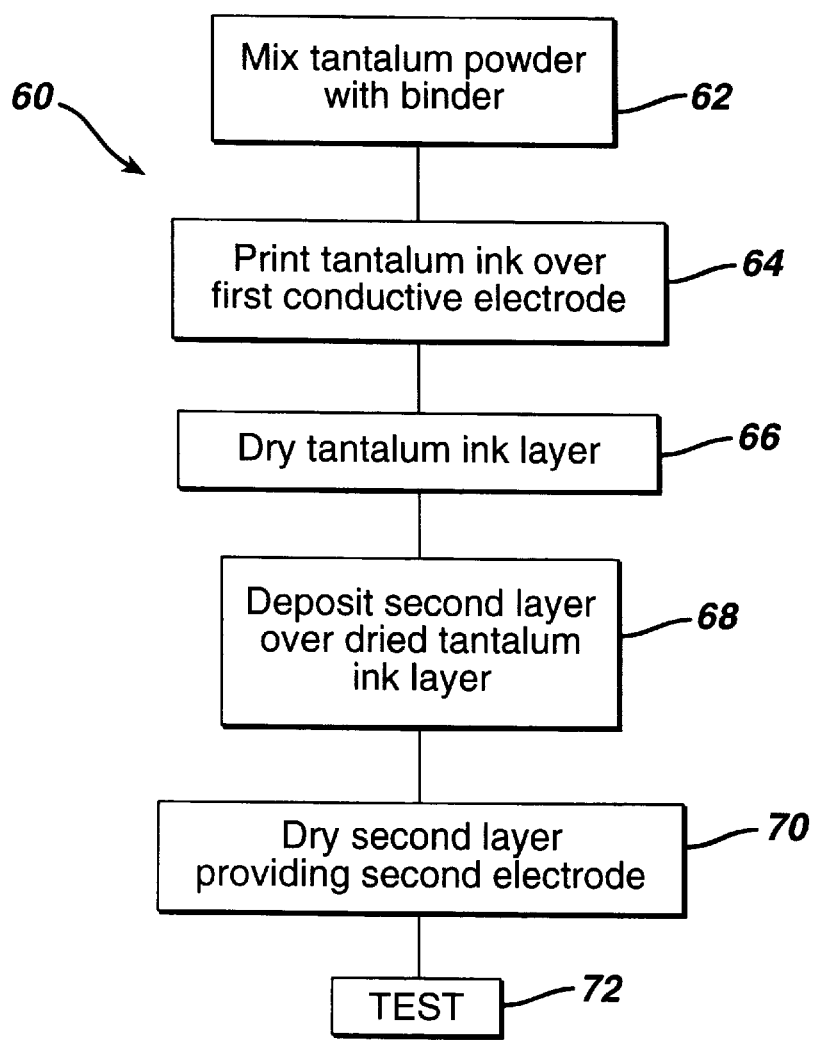
FIG. 6 is a flow chart of a process to manufacture the device of FIG. 3.

Referring now to FIG. 6, the device of FIG. 3 can be prepared as follows: The process 60 includes mixing 62 tantalum powder that is 99.97% pure, having the intrinsic oxide layer and having a particle size less than e.g., 5 microns, with a polymer binder such as Acheson, Electrodag No. 23DD146A, or Acheson SS24686, a more thixotropic material. Both polymer binders are available from Acheson, Port Huron, Mich. Other binders can be used with the tantalum to form a tantalum ink. The binders should be electrically insulating, stable with tantalum or the other metal used and preferably have an relatively high e.g., 15% to 35% or so solids content. The tantalum can be in a range of 100% to 39% of the total weight of the binder. Other ranges could be used. The tantalum particles and binder are mixed well to produce the tantalum ink. The tantalum ink is printed 64 on the first electrode e.g., a copper foil substrate or on other conductive material. The layer is printed, for example, by either draw down bars, screen printing, flexo or gravure printing techniques. The layer is dried 66, e.g., in an oven at 120° C. for 15–20 minutes. A second conductive layer such as chromium in the form of chromium particles mixed in a binder material is printed 68 on the tantalum binder layer. This chromium layer is also dried 40 at e.g., at 120° C. for 15–20 minutes producing the device 40. Thereafter, the device 40 can be tested 42.

Alternative conductive layers or metals such as copper, tungsten, molybdenum, carbon and so forth can be used for the first and/or second electrode. The conductivity of this layer can be varied by changing relative concentrations of conductive material to binder. Exemplary ranges for conductive material are 30% to 39%. By varying the conductivity of this layer, the shape of the current-voltage characteristic curve can be varied, making it a little sharper producing a diode having a steeper on/off response.

Processing is simplified because the tantalum particles used have an intrinsic oxide layer 50a. There is no need to thermally anneal or otherwise thermally preprocess the tantalum powder. The intrinsic oxide coating is very consistent in thickness and quality. This tends to produce very consistent metal-insulator layer materials and hence diodes with switching voltages having relatively low standard deviations over a series of diodes.

Another advantage is that since there is no need to thermally anneal the tantalum powder, the properties of the ink can be adjusted to achieve various diode properties to fit different applications. Ink formulation may be an easier process to control than thermal processing of the tantalum.

This device could also be referred to as a varistor, i.e., a thin printed varistor. This M-I-M structure is good for applications that need a nonlinear element that operates at low voltages and perhaps low current that can be printed rather than using semiconductor deposition techniques.

Figure 7A:
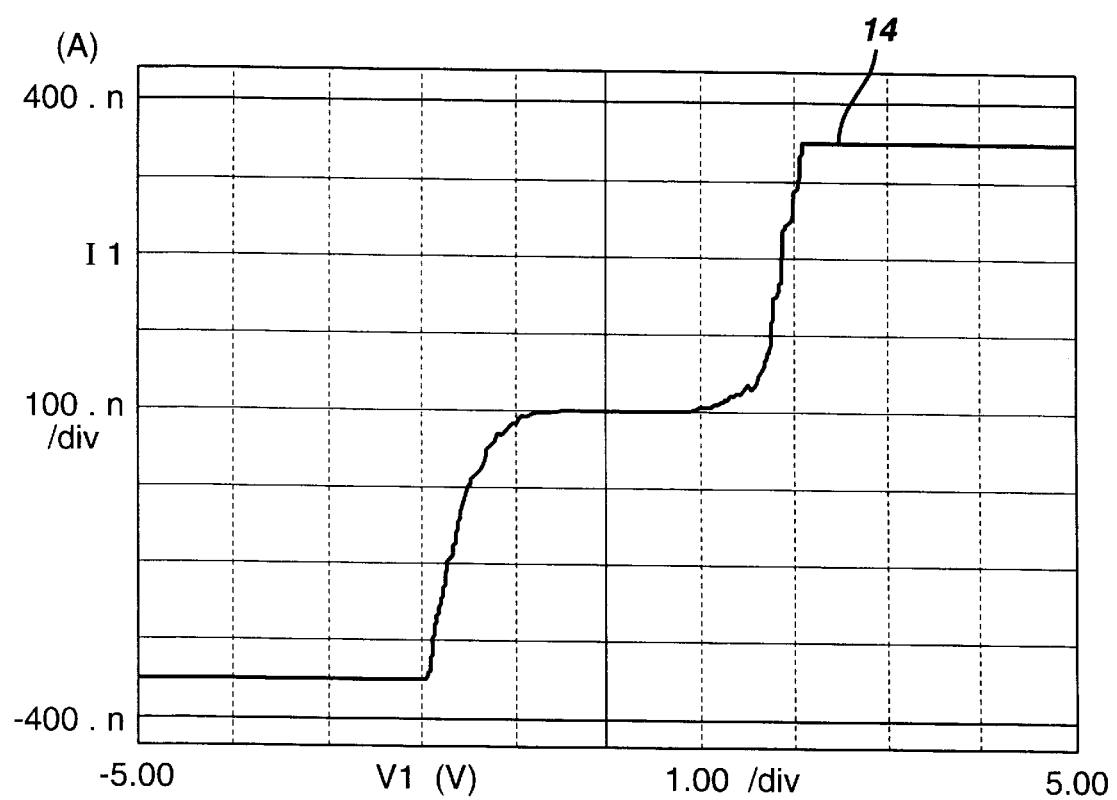
FIGS. 7A—7D are plots of voltage vs. current showing typical switching characteristics of M-I-M diode devices of FIGS. 3–6.

Referring now to FIGS. 7A–7D plots of voltage vs. current showing typical switching characteristics of M-I-M diode devices of FIGS. 3–6 are shown. As shown in FIG. 7A, a current voltage characteristic curve 74 for a M-I-M diode device exhibits a switching voltage at 100 na. (nanoamperes) of approximately 1.8 volts, with an on/off ratio that is calculated to be about 33. The current voltage characteristic curve 74 was obtained using a Hewlett Packard semiconductor analyzer, Model No. 4155B.

This device used a tantalum layer that was prepared by mixing 5 grams of tantalum particles obtained from Alfa Aesar, Ward Hill, Mass. having a particle diameter of less than 2 microns, with 20 grams of Electrodag 23DD146A polymer having a 25% solid versus 75% volatile compound composition. The ink was coated onto a conductive surface of copper foil using a 15 mil cutout i.e., to produce a layer having a wet thickness of 15 mils. The sample was dried in an oven at 120° C. for 20 minutes. The ink for the second layer of the diode was prepared by mixing 5 grams of chromium powder with a particle size of less than 5 microns as received from Alfa Aesar, with 4 grams of Electrodag 23DD146A and was coated on top of the tantalum ink layer using a 5 mil cutout. This coating was dried for 20 minutes at 120° C.

Figure 7B:
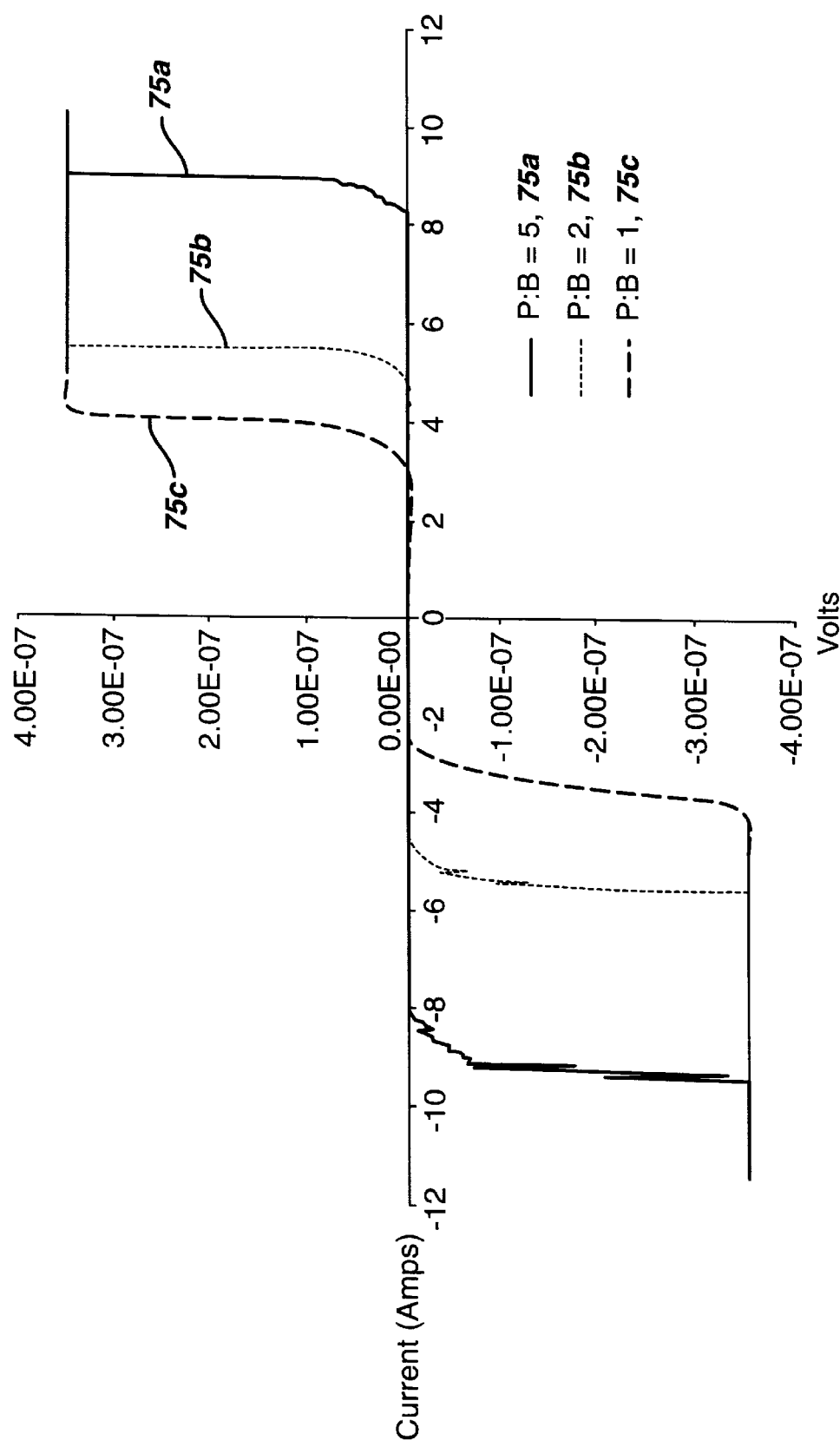

As shown in FIG. 7B, the M-I-M diodes can exhibit different switching voltages based upon different "P:B" ratios, that is, different ratios of metal (e.g., tantalum) particles to binder. As shown in FIG. 7B, for the same thickness of 15 mils, with P:B ratios of 5, 2, and 1, devices exhibit switching voltages of approximately 9 volts (curve 75a), 5.3 volts (curve 75b) and 3.8 volts (curve 75c) at 100 nano amperes.

Figure 7C:
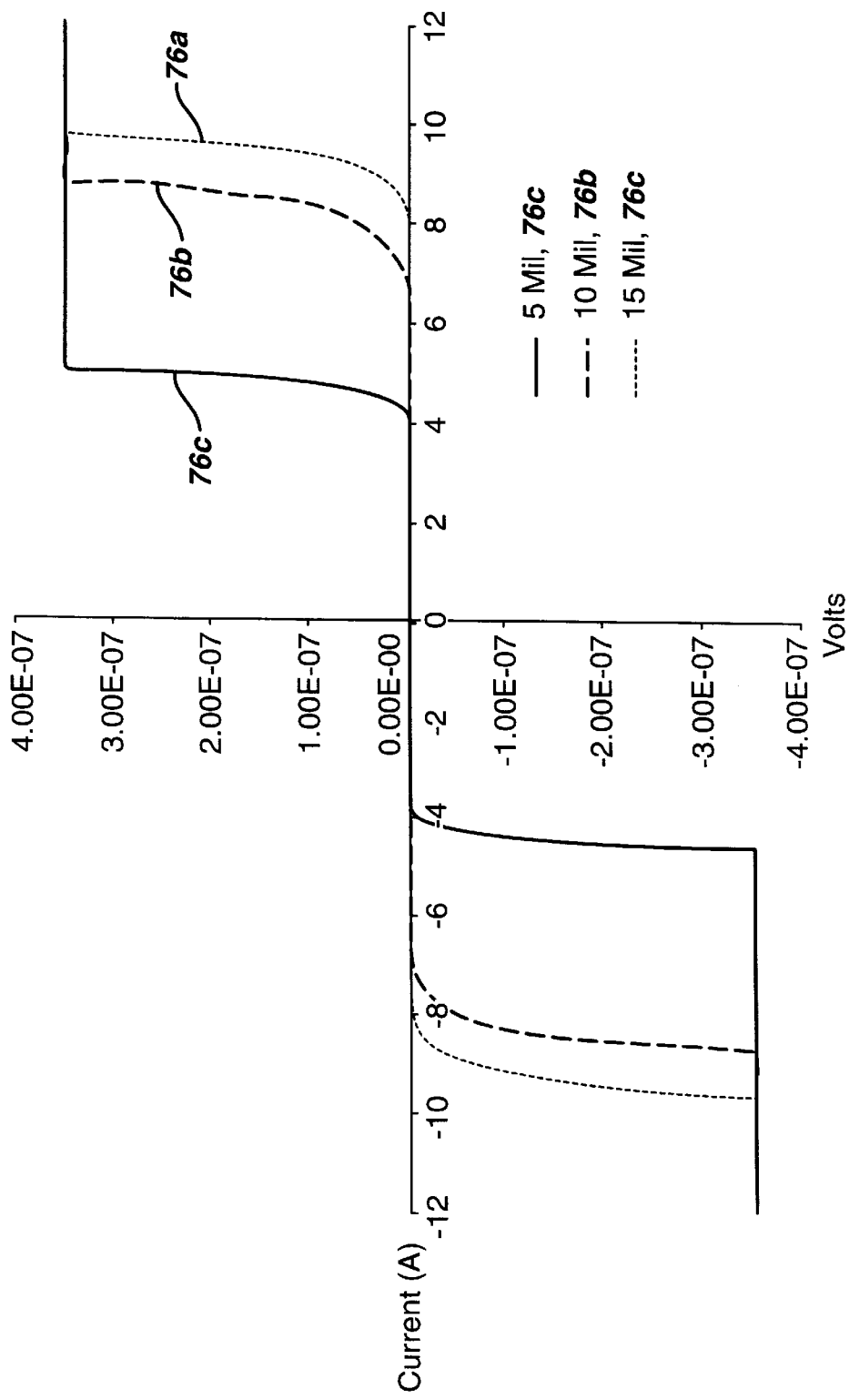

As also shown in FIG. 7C, varying the wet thickness of the tantalum layer can also produce varying switching voltages. With a tantalum layer having a tantalum to binder ratio (P:B) of 8:1, a M-I-M diode having a 15 mil thick tantalum layer would exhibit a switching voltage of approximately 9 volts (curve 76a), a 10 mil thick layer would provide a M-I-M diode with a switching voltage of approximately 7.8 volts (curve 76b), and a 5 mil thick layer would provide a M-I-M diode with a switching voltage of approximately 4.6 volts (curve 76b). Each of the switching voltages are measured at 100 nano amperes.

Figure 7D:
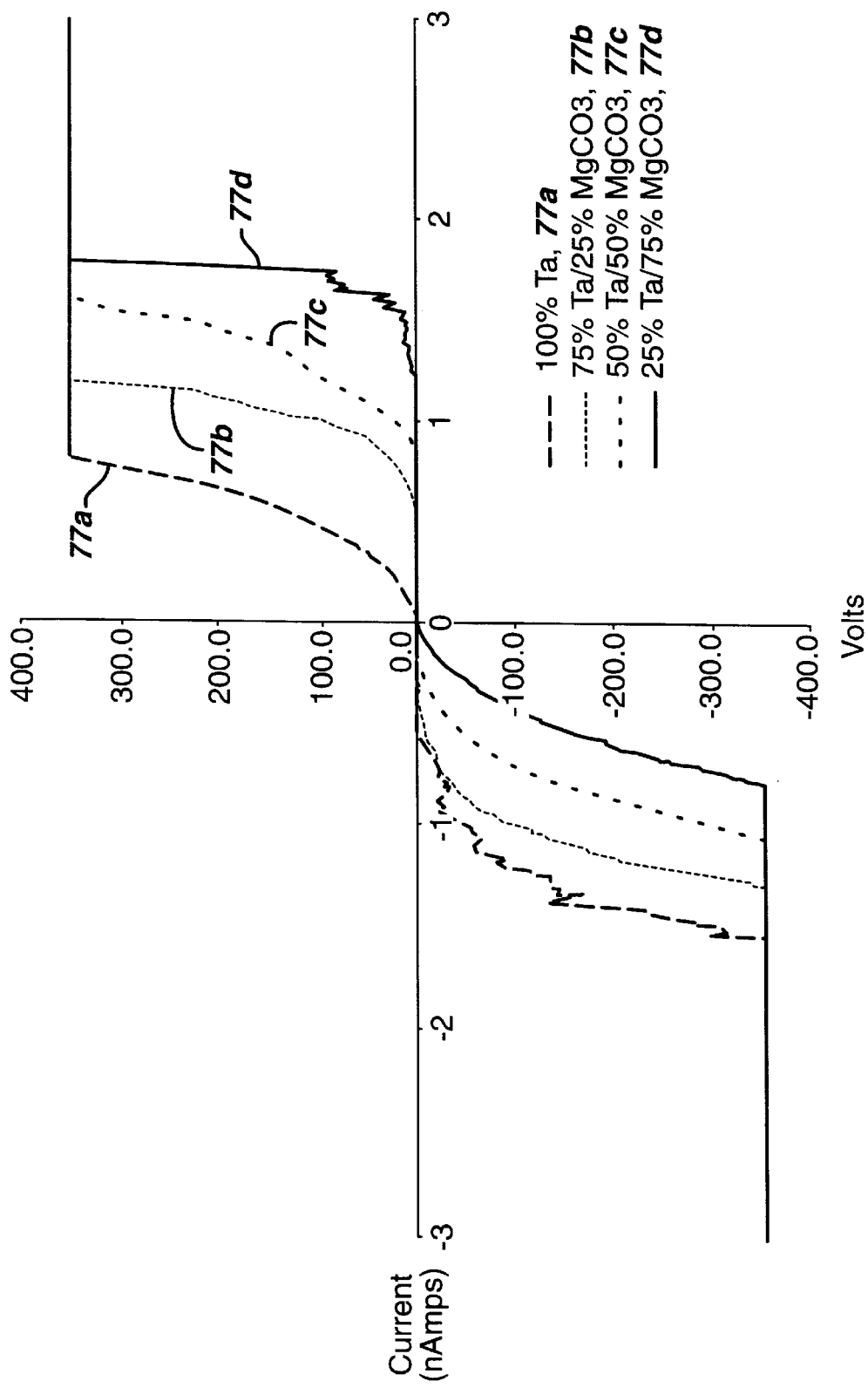

Referring now to FIG. 7D, addition of magnesium carbonate to the tantalum layer can produce M-I-M diodes that have consistently high on/off ratios with minimal impact on switching voltage. As shown in FIG. 7D, as the amount of magnesium carbonate is increased, the switching voltage characteristic becomes steeper. The curve 76a shows the switching characteristic for a 100% tantalum layer having a P:B ratio of 1:1 that exhibits a switching voltage of 1.8 volts. Curves 77b–77d illustrate that as the amount of magnesium carbonate increases, the switching characteristic becomes steeper therefore indicating a better on/off ratio.

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A battery tester, comprising:
   a voltage controlled display;
   a voltage divider having a terminal coupled to a terminal of the voltage controlled display; and
   a metal-insulator-metal device coupled to the voltage divider and a second terminal of the voltage controlled display, the metal-insulator-metal device an electrode, a metal-insulator layer comprising metal particles having a self-limiting and stable intrinsic oxide layer, the particles suspended in a dielectric binding layer with the intrinsic oxide in contact with the layer, and a second electrode disposed on the metal-insulator layer opposite the first electrode.

2. The battery tester of claim 1 wherein the display is an electrophoretic display.

3. The battery tester of claim 1 wherein the non-linear device is a metal-insulator-metal diode.

4. The battery tester of claim 1 wherein the voltage divider includes a pair of resistors having the same resistance.

5. The battery tester of claim 1 further comprising a resistor and wherein the resistor is coupled in series with the non-linear device.

6. The battery tester of claim 1 wherein the tester in operation is always coupled to the battery.

7. The battery tester of claim 1 wherein a voltage potential at the first terminal of the display is a fraction of a battery cell voltage and a potential at the second terminal of the display is determined by a voltage across the non-linear element and resistor.

8. The battery tester of claim 7 wherein as current is drawn from a battery due to use or leakage, the voltage of one of the terminals of the display will vary with respect to the voltage at the other terminal of the display.

9. The battery tester of claim 8 wherein the non-linear device will switch states causing the voltage at one terminal of the display to become negative with respect to the voltage at the other terminal of the display to cause a change in color of the display to indicate that the battery is no longer within some defined specification.

10. A battery comprising:

a cell having an outer circumference; and a battery tester disposed on the outer circumference of the cell, said battery tester comprising:
 a voltage controlled display;
 a voltage divider having a terminal coupled to a terminal of the voltage controlled display; and
 a circuit path coupled in parallel with the voltage divider including a non-linear device and a resistor coupled in series wherein the non-linear device has a switching voltage characteristic that corresponds in magnitude to a voltage of the cell.

11. The battery of claim 10 wherein the display of the tester is an electrophoretic display.

12. The battery of claim 10 wherein the non-linear device of the tester is a metal-insulator-metal diode.

13. The battery of claim 10 wherein the voltage divider of the tester includes a pair of resistors having the same resistance.

14. The battery of claim 11 wherein the non-linear device of the tester is a metal-insulator-metal diode and the voltage divider of the tester includes a pair of resistors having the same resistance.

15. The battery of claim 10 wherein the tester is in continuous electrical contact with the cell.

16. The battery of claim 10 wherein a voltage potential at the first terminal of the display is some fraction of a battery cell voltage and a potential at the second terminal of the display is determined by voltage across the nonlinear element and resistor.

17. The battery of claim 16 wherein as current is drawn from a battery due to use or leakage, the voltage of one of the terminals of the display will vary with respect to the voltage at in the other terminal of the display.

18. The battery of claim 17 wherein the non linear device will switch states causing the voltage at one of the terminal of the display to become negative with respect to the voltage at the other terminal of the display to cause a change in color of the display to indicate that the battery is no longer within some defined specification.

19. A battery tester, comprising:

a battery;

a voltage controlled electrophoretic display;

a voltage divider having a terminal coupled to a terminal of the display;

a metal-insulator-metal diode coupled to the voltage divider and a second terminal of the display, the metal-insulator-metal diode comprising an electrode, a metal-insulator layer comprising metal particles having a self-limiting and stable intrinsic oxide layer, the particles suspended in a dielectric binding layer, and a second electrode disposed on the metal-insulator layer opposite the first electrode, the metal-insulator-metal diode being responsive to whether the battery is within a predefined specification, such that the metal-insulator-metal diode will switch states causing a voltage at one terminal of the display to switch polarity with respect to a voltage at the other terminal of the display, the polarity switch causing a visible change in the display.

20. The battery tester of claim 19, wherein the metal particles are tantalum particles.

21. The battery tester of claim 19, wherein the metal particles are niobium particles.

22. A battery tester, comprising:

a battery;

a voltage controlled electrophoretic display;

a voltage divider having a terminal coupled to a terminal of the display;

a metal-insulator-metal diode coupled to the voltage divider and a second terminal of the display, the metal-insulator-metal diode comprising an electrode, a metal-insulator layer comprising metal particles having a self-limiting and stable intrinsic oxide layer, the particles suspended in a dielectric binding layer, with the intrinsic oxide in intimate contact with the dielectric binder layer, and a second electrode disposed on the metal-insulator layer opposite the first electrode, the metal-insulator-metal diode having a switching voltage within the range of voltages produced by the battery, such that the metal-insulator-metal diode will switch states causing a voltage at one terminal of the display to switch polarity with respect to a voltage at the other terminal of the display, the polarity switch causing a visible change in the display.

* * * * *

UNITED STATES PATENT AND TRADEMARK OFFICE
CERTIFICATE OF CORRECTION

PATENT NO. : 6,291,096 B1
DATED : September 18, 2001
INVENTOR(S) : David N. Klein It is certified that error appears in the above-identified patent and that said Letters Patent is hereby corrected as shown below:

<u>Title page,</u>
Item [56], OTHER PUBLICATIONS, delete "?Electrophoretic Displays" and replace with -- "Electrophoretic Displays" --.

<u>Column 6,</u>
Line 57, after "device" insert -- comprising --.

<u>Column 7,</u>
Line 57, after "at" and before "the", insert -- in --.

Signed and Sealed this

Twenty-eighth Day of January, 2003

JAMES E. ROGAN
*Director of the United States Patent and Trademark Office*